United States Patent [19]
Ozawa

[11] Patent Number: 5,487,128
[45] Date of Patent: Jan. 23, 1996

[54] SPEECH PARAMETER CODING METHOD AND APPPARATUS

[75] Inventor: Kazunori Ozawa, Tokyo, Japan

[73] Assignee: NEC Corporation, Japan

[21] Appl. No.: 841,726

[22] Filed: Feb. 26, 1992

[51] Int. Cl.$^6$ .............................. G10L 5/00; G10L 9/14
[52] U.S. Cl. ........................................ 395/2.31; 395/2.28
[58] Field of Search .................. 381/36, 29–40; 395/2, 2.28–2.32, 2.38, 2.39

[56] References Cited

U.S. PATENT DOCUMENTS

| | | | |
|---|---|---|---|
| 5,142,581 | 8/1992 | Tokuda et al. | 381/36 |
| 5,208,862 | 5/1993 | Ozawa | 381/36 |
| 5,271,089 | 12/1993 | Ozawa | 395/2.31 |

FOREIGN PATENT DOCUMENTS

| | | | |
|---|---|---|---|
| 0443548 | 8/1991 | European Pat. Off. | G10L 9/14 |
| 3-243999 | 10/1991 | Japan | G10L 9/18 |

OTHER PUBLICATIONS

Schroeder, et al., *Code–Excited Linear Prediction (CLEP): High–Quality Speech At Very Low Bit Rates*; pp. 937–940; 1985 IEEE.

Kleiijn, et al., *Improved Speech Quality and Efficient Vector Quantization in Selp*; pp. 155–158, 1988 IEEE.

Masaaki Honda, *Speech Coding Using Waveform Matching Based on LPC Residual Phase Equalization*; pp. 213–216; 1990 IEEE.

Iso, et al., *Speaker–Independent Word Recognition Using a Neural Prediction Model* pp. 441–444; 1990 IEEE.

Sugamura, et al., *Quantizer Design in LSP Speech Analysis–Synthesis*; pp. 432–440; IEEE Journal on Selected Areas in Communications, vol. 6, No. 2 Feb. 1988.

*Primary Examiner*—David D. Knepper
*Attorney, Agent, or Firm*—Ostrolenk, Faber, Gerb & Soffen

[57] ABSTRACT

A speech parameter coding method and apparatus which can quantize a spectrum parameter of a speech signal with a smaller number of bits smaller than ever. A dividing section divides a predetermined order number of spectrum parameters, obtained by division of a speech signal into frames, for each order number of spectrum parameters smaller than the divisional order number. A vector quantizing section searches codebooks for the divided spectrum parameters for each order number and outputs a plurality of candidates of codevector in order of magnitude from the minimum one. An accumulated distortion calculating section calculates accumulated distortions for the entire order number for combinations of codevectors. A minimum judging section selectively outputs a combination of codevectors which minimizes the accumulated distortion thereby to quantize the spectrum parameter.

7 Claims, 8 Drawing Sheets

FRAME

SPEECH PARAMETER CODING METHOD AND APPPARATUS

BACKGROUND OF THE INVENTION

1. Field of the Invention

This invention relates to a speech parameter coding method and apparatus for use with a speech coding method and system for coding a speech signal with high quality at a low bit rate, specifically, at about 8 kb/s or less.

2. Description of the Prior Art

Various methods of coding a speech signal at a low bit rate of 8 kb/s or less are already known. One exemplary conventional coding method is CELP (Code Excited Linear Prediction), which is disclosed, for example, in M. R. Shroeder and B. S. Atal, "CODE-EXCITED LINEAR PREDICTION (CELP): HIGH-QUALITY SPEECH AT VERY LOW BIT RATES", *Proc. ICASSP,* pp. 937–940, 1985 (reference 1) and also in W. B. Kleijn et al., "IMPROVED SPEECH QUALITY AND EFFICIENT VECTOR QUANTIZATION IN SELP", *Proc. ICASSP,* pp. 155–158, 1988 (reference 2). According to the method, on the transmission side, a spectrum parameter representing a spectrum characteristic of a speech signal is extracted from the speech signal for each frame (e.g., 20 ms). Each frame is divided into subframes of, for example, 5 ms, and a pitch parameter representing a long-term correlation (pitch correlation) is extracted for each subframe from excitation signal in the past. Then, long-term prediction (pitch prediction) of the speech signal of the subframes is performed using the pitch parameter. In accordance with a residual signal obtained by such long-term prediction, a noise signal is selected from a codebook which is constructed from predetermined noise signals so that the error power between the speech signal and a signal synthesized using the selected signal may be minimized, and an optimal gain is calculated. An index representing the kind of the thus selected noise signal and the gain are transmitted together with the spectrum parameter and the pitch parameter.

An efficient quantizing method not only for a excitation signal but also for a spectrum parameter is significant in order to further reduce the bit rate of such CELP method.

In the CELP method described above, an LPC parameter which is found by an LPC analysis is quantized as a spectrum parameter. Scalar quantization is normally employed as such quantizing method, and a bit number of 34 bits per frame (1.7 kb/s) or so is required to quantize 10th order LPC coefficients. While it is necessary to reduce the bit number of a spectrum parameter as low as possible in order to reduce the bit number of the CELP method below 4.8 kb/s, if the bit number is reduced in this manner, then the sound quality is deteriorated accordingly. A vector-scalar quantizing method has been proposed as a method of quantizing an LPC parameter more efficiently and is disclosed, for example, in Moriya, "Transform Coding of Speech Using a Weighted Vector Quantizer", *IEEE J. Sel. Areas, Commun.,* pp. 425–431, 1988 (reference 3). However, such vector-scalar quantizing method still requires a bit number of 27 to 30 bits per frame. Accordingly, a more efficient method is required for the reduction of the bit rate.

Further, since the number of bits necessary for quantization of a spectrum parameter is reduced, if a greater length is provided to frames, then it is difficult to represent a change in time of a spectrum well and the distortion in time is increased, which results in deterioration in sound quality.

SUMMARY OF THE INVENTION

It is an object of the present invention to provide a speech parameter coding method and apparatus by which a good sound quality can be obtained even by quantization of a spectrum parameter with a smaller number of bits than ever before.

In order to attain the aforementioned object, according to one aspect of the present invention, there is provided a speech parameter coding method, which comprises the steps of:

receiving an input speech signal;

dividing the received speech signal into a plurality of frames of a predetermined time length;

finding a predetermined order number of spectrum parameters of the speech signal for each of the frames;

dividing the spectrum parameters for a predetermined plural smaller order number of spectrum parameters;

searching a codebook for the thus divided spectrum parameters to obtain a plurality of candidate of codevectors;

finding accumulated distortions for the entire order number for combinations of the codevectors; and selecting a combination of codevectors which minimizes the accumulated distortion thereby to quantize the spectrum parameters.

With the speech parameter coding method, when spectrum parameters representative of spectrum parameters of speech are to be quantized, the spectrum parameters are divided into a plurality of divisions each including the predetermined plural order number of spectrum parameters and are then quantized for each such division. Further, since a plurality of candidates and accumulated values of quantizing distortions for combinations of the candidates for the entire order number are found and then a combination of candidates which minimizes the accumulated value is selected, there is an advantage that a quantizer can be provided which is high in performance with a comparatively small amount of calculation with a small number of bits.

According to another aspect of the present invention, there is provided a speech parameter coding method, which comprises the steps of:

receiving an input speech signal;

dividing the received speech signal into a plurality of frames;

finding a predetermined order number of spectrum parameters of the speech signal for each of the frames;

representing the spectrum parameters in a multi-stage cascade connection of a plurality of codebooks;

obtaining a plurality of candidate codevectors at at least one of the stages of the multi-stage cascade connection;

dividing, at the other stage or at at least one of the other stages of the multi-stage cascade connection, the spectrum parameters for each predetermined order number smaller than the order number;

searching other codebooks for the divided spectrum parameters to obtain a plurality of candidates of codevector;

finding accumulated distortions for the entire cascade connection for combinations of the candidates; and selecting a combination of codevectors which minimizes the accumulated distortion thereby to quantize the spectrum parameters.

With the speech parameter coding method, the construction of the speech parameter coding method of the first aspect of the present invention is combined with multi-stage cascade connection vector quantization. Accordingly, it is advantageous in that a vector quantizer can be provided which further reduces the memory capacity and calculation power necessary for storage of codebooks and is high in performance.

According to a further aspect of the present invention, there is provided a speech parameter coding method, which comprises the steps of:

receiving an input speech signal;

dividing the input speech signal into a plurality of frames;

dividing each of the frames into a plurality of shorter subframes;

finding a predetermined order number of spectrum parameters for the speech signal of at least one of the subframes;

quantizing the spectrum parameters of at least one of the subframes using a first codebook constructed in advance; and quantizing parameters of the other subframe or at least one of the other subframes using the quantized values and a second codebook constructed in advance or non-linear processing.

With the speech parameter coding method, when spectrum parameters representative of spectrum characteristics of speech are to be quantized, a frame is divided into a plurality of shorter subframes and spectrum parameters are found and vector quantized for at least one of the subframes while spectrum parameters of the other subframe or subframes are represented by predictors based on the thus vector quantized values. Accordingly, there is an advantage that, even if the frame length is increased in order to reduce the bit rate, spectrum parameters can be quantized well with a small number of bits and a small amount of calculation and also a temporal change can be represented well.

According to a still further aspect of the present invention, there is provided a speech parameter coding method, which comprises the steps of:

receiving an input speech signal;

dividing the input speech signal into a plurality of frames;

dividing each of the frames into a plurality of shorter subframes;

finding a predetermined order number of spectrum parameters for the speech signal of at least one of the subframes;

quantizing the spectrum parameters of one of the subframes using a first codebook constructed in advance;

finding difference signals between the spectrum parameters of the other subframe or at least one of the other subframes and the quantized values; and quantizing the difference signals using a second codebook constructed in advance.

With the speech parameter coding method, since spectrum parameters of the other subframes are represented by vector quantized values of difference signals, there is an advantage that, even if the frame length is increased in order to reduce the bit rate, spectrum parameters can be quantized well with a small number of bits and a small amount of calculation and also a temporal change can be represented well.

According to a yet further aspect of the present invention, there is provided a speech parameter coding apparatus, which comprises:

means for dividing an input speech signal into a plurality of frames;

means for finding a predetermined order number of spectrum parameters from the speech signal;

means for vector quantizing the spectrum parameters;

means for scalar quantizing difference signals between the spectrum parameters and the vector quantized values; and means for determining a predetermined order number of quantizing ranges for the scalar quantization for each of a predetermined number of codevectors of the vector quantizing means so as to cause the scalar quantizing means to perform scalar quantization within the quantizing ranges.

According to a yet further aspect of the present invention, there is provided a speech parameter coding apparatus, which comprises:

means for dividing an input speech signal into a plurality of frames;

means for finding a predetermined order number of spectrum parameters from the speech signal;

means for vector quantizing the spectrum parameters;

means for scalar quantizing difference signals between the spectrum parameters and the vector quantized values;

means for producing a plurality of candidates of quantizing value for each order number of the spectrum parameters at the scalar quantizing means;

means for modifying, using each of the candidates, a quantizing range of an adjacent spectrum parameter; and means for accumulating a predetermined order number of quantizing distortions by the quantized values and producing a quantized value sequence which minimizes the accumulated distortion.

According to a yet further aspect of the present invention, there is provided a speech parameter coding apparatus, which comprises:

means for dividing an input speech signal into a plurality of frames;

means for finding a predetermined order number of spectrum parameters from the speech signal;

means for vector quantizing the spectrum parameters;

means for scalar quantizing difference signals between the spectrum parameters and the vector quantized values;

means for determining a predetermined order number of quantizing ranges for the scalar quantization for each of a predetermined number of codevectors from the vector quantizing means;

means for producing a plurality of candidates of quantizing value for each order number of the spectrum parameters for the scalar quantization;

means for modifying, using each of the candidates, a quantizing range of an adjacent spectrum parameter; and means for accumulating a predetermined order number of quantizing distortions by the quantizing values and producing a quantized value sequence which minimizes the accumulated distortion.

With the speech parameter coding apparatus, when spectrum parameters of a speech signal are vector quantized and then difference signals between the spectrum parameters and the vector quantized values are to be scalar quantized, a predetermined frame number of quantizing ranges for scalar quantization are determined for a predetermined number of codevectors for vector quantization and scalar quantization is performed within such quantizing ranges. Further, when such difference signals are to be scalar quantized, a plurality of candidates of quantized value by scalar quantization are produced and then the quantizing ranges of adjacent spectrum parameters are corrected using the quantized value candidates, whereafter a predetermined order number of quantizing distortions when scalar quantization is performed for each of the candidates are accumulated and then a quantized value sequence which minimizes the accumulated distortion is produced. Accordingly, there is a significant advantage that the number of bits required for quantization of spectrum parameters can be decreased compared with conventional speech parameter coding apparatus.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
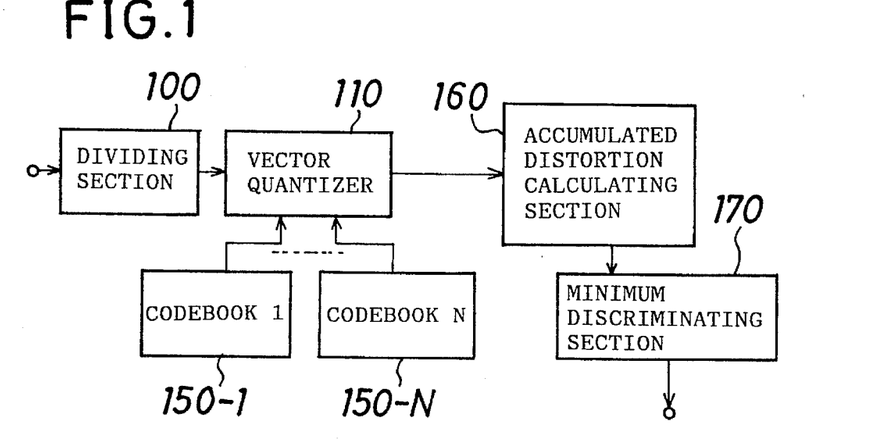
FIG. 1 is a block diagram showing a speech parameter coding system to which the present invention is applied.

Referring first to FIG. 1, there is shown a speech parameter coding system to which the present invention is applied.

The speech parameter coding system receives a predetermined order number of (for example, order P) spectrum parameters calculated from a speech signal for each frame. A well-known linear predictive coding (LPC) analysis can be employed for the analysis of such spectrum parameters. While various spectrum parameters are known, here a line spectrum pair (LSP) parameter is employed for the convenience of description. A detailed computational procedure for LSP parameters is disclosed, for example, in N. Suganuma, "Quantizer Design in LSP Speech Analysis-Synthesis", *IEEE J. Sel. Areas Commun.*, pp. 425–431, 1988 (reference 4).

A dividing section 100 of the speech parameter coding system thus receives Pth-order LSP parameters, divides them into a plurality of, for example, N, sets each including Kth-order LSP parameters (K<P) and sends each such Kth-order LSP parameters to a vector quantizer 110. The vector quantizer 110 has N codebooks 150-1 to 150-N constructed in advance corresponding to the dividing number at the dividing section 100 and each including Kth-order codevectors. Here, while the codebooks 150-1 to 150-N may be constructed such that they include the LSP parameters as they are, they may otherwise be constructed such that they may represent, making use of the characteristic that such LSP parameters have a high correlation between them at different order numbers, difference values between different spectrum parameters at different order numbers in order to represent them with higher efficiency. The ith spectrum parameter can be represented, using codevectors included in the codebooks 150-1 to 150-N, in the following equation:

$$\omega'_i = \omega'_{i-1} + \Delta\omega'_{ij} \tag{1}$$

where $\Delta\omega'_{ij}$ is the jth codevector included in the ith codebook 150-i.

Here, the codebooks 150-1 to 150-N are constructed by learning difference values between spectrum parameters at different order numbers for each predetermined order number as training signals. Such learning method is disclosed, for example, in Linde, Buzo and Gray, "An Algorithm for Vector Quantization Design" (reference 5).

The vector quantizer 110 calculates a quantizing distortion for each Kth-order parameters in accordance with the following equation:

$$D = \sum_i [\omega_i - \omega'_{ij}]^2 \tag{2}$$

where $\omega_i$ is the input ith-order LSP parameter, and $\omega'_{ij}$ is the ith-order LSP parameter represented using the jth codevector. The vector quantizer 110 outputs M candidates of codevectors which minimize the equation (2) above for each Kth-order parameters in order of magnitude of distortion from the smaller one. An accumulated distortion calculating section 160 calculates an accumulated distortion E for all possible combinations of the M codevectors outputted for each Kth-order parameters in accordance with the following equation:

$$E = \sum_{i=1}^{N} D_i \tag{3}$$

A minimum discriminating section 170 finds a combination of candidates which minimizes the accumulated distortion E, and outputs the combination of codevectors then.

Figure 2:
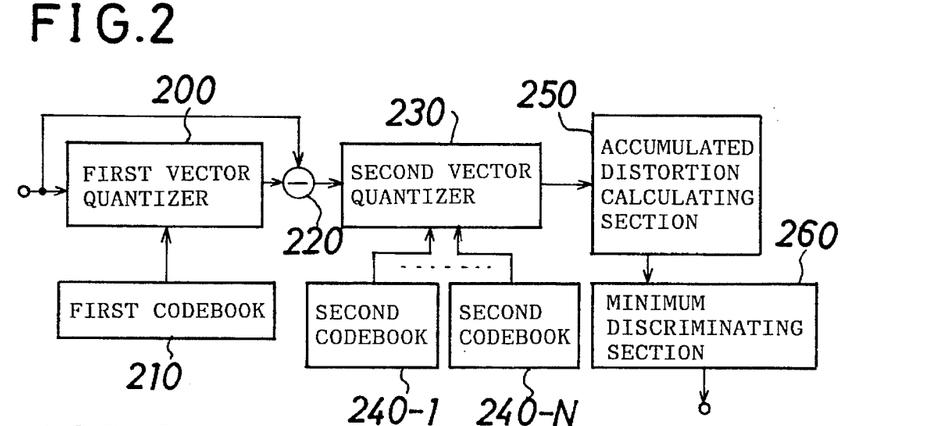
FIG. 2 is a similar view but showing another speech parameter coding system to which the present invention is applied.

Referring now to FIG. 2, there is shown another speech parameter coding system to which the present invention is applied. The present speech parameter coding system is different from the preceding speech parameter coding system of FIG. 1 in that the vector quantizing codebooks are connected in cascade connection at a plurality of stages and each of such stages receives an error signal indicating the error between an input signal to the preceding stage and an output signal of the preceding stage and represents it in a codebook. Also, a codebook at at least one stage represents differences between spectrum parameters at different order numbers. Here, the specific speech parameter coding system shown in FIG. 2 has two stages wherein spectrum parameters are not divided at the first stage but are divided into subframes for each Kth-order spectrum parameters.

The speech parameter coding system receives Pth-order spectrum parameters, and the thus received Pth-order spectrum parameters are quantized by a first vector quantizer 200 using a first codebook 210 which is constructed by learning Pth-order spectrum parameters in advance. Here, the first vector quantizer 200 calculates a distortion of the equation (2) given hereinabove using codevectors j of the codebook 210 and outputs M candidates in order of magnitude of distortion from the minimum. A subtractor 220 calculates, for each of the M candidates, an error signal of it from the input spectrum parameter and outputs the error signal to a second vector quantizer 230. The second vector quantizer 230 divides such error signals for each predetermined Kth-order parameters. Further, the second vector quantizer 230 represents the error signals using second codebooks 240-1 to 240-N which represent differences between parameters at different order numbers for each Kth-order parameters. Here, the equations (1) and (2) given hereinabove are used for the calculation of a distortion. Further, the second vector quantizer 230 outputs M codevectors in order of magnitude of distortion of the equation (2) from the minimum one as candidates for each K parameters. An accumulated distortion calculating section 250 calculates accumulated distortions for all possible combinations of the M candidates outputted from the first stage and the candidates outputted from the second stage for each Kth-order parameters. A minimum discriminating section 260 finds a combination of candidates which minimizes an accumulated distortion and outputs a combination of codevectors then.

Here, learning of the first codebook is performed for Pth-order LSP parameters for the training using reference 5 mentioned hereinabove. Meanwhile, learning of the second codebooks is performed for error signals using a similar method to that used in the speech parameter coding system described hereinabove with reference to FIG. 1.

Figure 3:
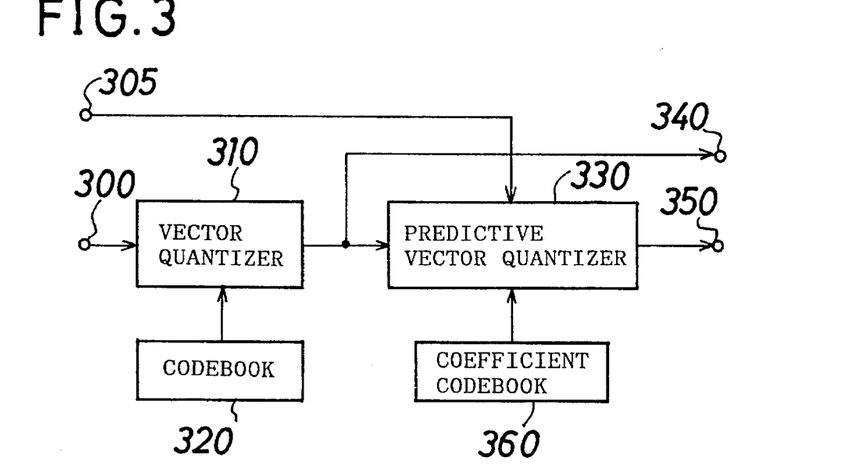
FIG. 3 is a similar view but showing a further speech parameter coding system to which the present invention is applied.

Referring now to FIG. 3, there is shown a further speech parameter coding system to which the present invention is applied. The present speech parameter coding system divides an input speech signal into a plurality of frames of a predetermined time length (for example, 30 to 40 ms) and then divides the speech signal for each frame into a plurality of subframes (for example, 5 to 8 ms) shorter than the frame, after which it performs a well-known LPC analysis for at least one subframe in each frame to find a spectrum parameter. The present speech parameter coding system is hereinafter described as performing an LPC analysis, for example, for two subframes in each frame to find spectrum parameters. More particularly, an LPC analysis is performed, for example, for the second and fourth subframes among five subframes of a frame shown in FIG. 4. The thus found spectrum parameters are received by way of a pair of terminals 300 and 305 of the speech parameter coding system. Here, the spectrum parameter of the subframe 2 is received via the terminal 300 while the spectrum parameter of the subframe 4 is received via the terminal 305. The spectrum parameters here are assumed to be line spectrum pair (LSP) parameters for the convenience of description.

Such LSP parameters can be calculated using the calculating method disclosed, for example, in reference 4 mentioned previously. A vector quantizer 310 thus vector quantizes the input LSP parameters using a first codebook 320. The codebook 320 is constituted by earning in advance using a large amount of LSP parameter sequence for the training. Such learning method is disclosed, for example, in the mentioned reference 5. While various distortion scales for searching a codevector are already known, a squared distance between LSP parameters is employed as a distortion scale here. A squared distance between LSP parameters is given by the following equation:

$$D_1 = \sum_{i=1}^{P} \{LSP(i) - LSP'_j(i)\}^2 \tag{4}$$

where LSP(i) is the input ith LSP coefficient, and LSP'j(i) is the Jth codevector the codebook 320 has, where j=i to $2^B$ and B is a bit number of the codebook 320. The vector quantizer 310 outputs a codevector which minimizes the equation (4) above by way of a terminal 340 and further outputs the codevector to a predictive vector quantizer 330.

The predictive vector quantizer 330 predicts an LSP parameter sequence of the other subframe received by way of the terminal 305 using the output codevector of the vector quantizer 310 and a second or coefficient codebook 360 and calculates a predictive quantizing distortion in accordance with the following equation:

$$D_1 = \sum_{i=1}^{P} \{LSP(i) - LSP'(i) \cdot A_1(i)\}^2 \tag{5}$$

for l=1 to $2^{BB}$, where LSP'(i) are codevectors calculated by the vector quantizer 310, and $A_l(i)$ are the ith codevectors of the coefficient codebook 360. The predictive vector quantizer 330 finds coefficient codevectors which minimize the equation (5) above, and outputs then as quantizing values for the spectrum parameters of the subframes by way of a terminal 350. The predictive coefficients of the coefficient codebook 360 can be constructed by learning the LSP parameter signal for the training using reference 5 mentioned hereinabove or the like so that the equation (5) above may be minimized.

Alternatively, non-linear prediction may be performed using non-liner processing. Two such methods are available. One of the two methods employs a non-linear predictive codebook as the coefficient codebook 360. A learning method of such non-linear predictive codebook is disclosed, for example, in S. Wang et al., "Performance of Non-Linear Prediction of Speech", *Proc. ICSLP*, pp. 29–32, 1990 (reference 6). The other available method carries out prediction by a neural network instead of the predictive vector quantizer 330 and the coefficient codebook 360. Details of a predicting method by a neural network are disclosed, for example, in Iso et al., "Speaker-Independent Word Recognition Using a Neural Prediction Model", *Proc. ICASSP*, pp. 441–444, 1990 (reference 7).

Figure 5:
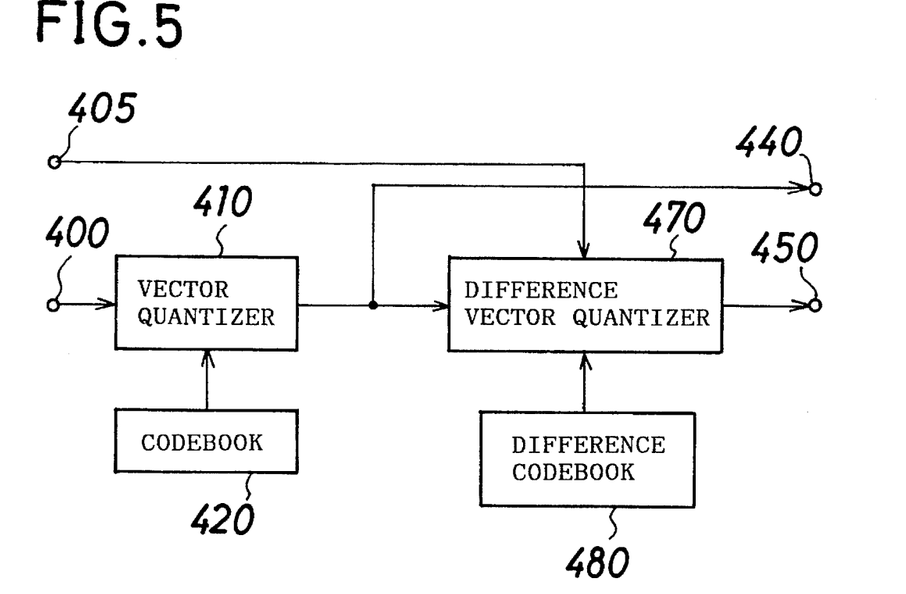
FIG. 5 is a block diagram showing a still further speech parameter coding system to which the present invention is applied.

Referring now to FIG. 5, there is shown a still further speech parameter coding system to which the present invention is applied. The present speech parameter coding system is similar to the speech parameter coding system shown in FIG. 3 in that it includes a vector quantizer 410 and a codebook 420 which are similar to the vector quantizer 310 and the codebook 320, respectively, but is different in that it includes a difference vector quantizer 470 and a difference codebook 480 in place of the predictive vector quantizer 330 and the coefficient codebook 360, respectively.

The difference vector quantizer 470 calculates a difference signal between an input LSP parameter sequence received by way of a terminal 405 and vector quantized outputs of the vector quantizer 410 in accordance with the following equation:

$$LSP_o(i) = LSP(i) - B \cdot LSP'(i) \qquad (6)$$

where B is a positive constant equal to or smaller than 1. The following description assumes that B=1.

The difference vector quantizer 470 performs vector quantization of the difference signal $LSP_o(i)$ using the difference codebook 480. Here, the difference codebook 480 is constructed by learning the training signal of difference LSP parameters in advance using, for example, the method disclosed in reference 5. Then, the difference vector quantizer 470 selects a codevector which minimizes the quantizing distortion, and outputs the selected codevector at a terminal 450.

Figure 6:
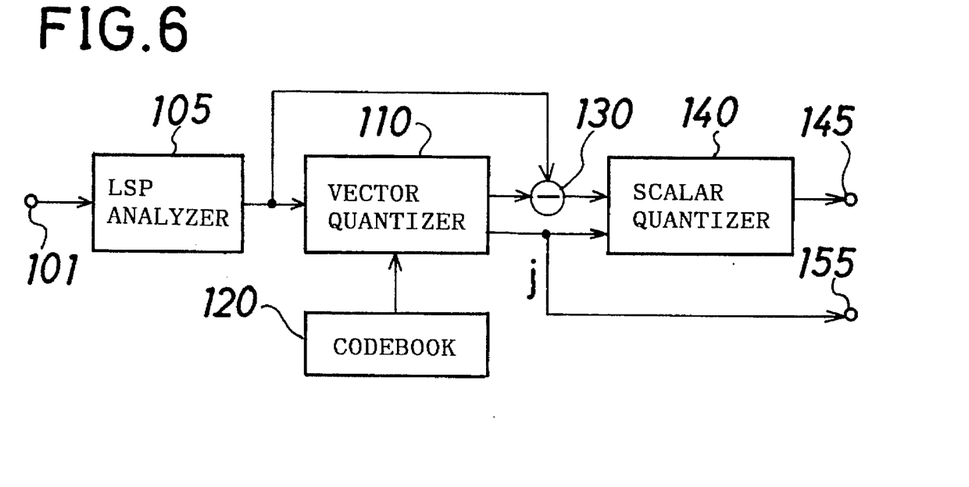
FIG. 6 is a block diagram showing a yet further speech parameter coding system to which the present invention is applied.

Referring now to FIG. 6, there is shown a yet further speech parameter coding system to which the present invention is applied. The present speech parameter coding system divides an input speech signal received at a terminal 101 into a plurality of frames of a predetermined time length (for example, 30 to 40 ms) and performs, at an LSP analyzer 105, a well-known analysis to find spectrum parameters. Here, the spectrum parameters may be line spectrum pair (LSP) parameters. A detailed calculating method of such LSP parameters is disclosed, for example, in reference 4. A vector quantizer 110 vector quantizes the input LSP parameters using a codebook 120. The codebook 120 is constructed by learning in advance using a large amount of an LSP parameter sequence for the training. Such learning method is disclosed, for example, in reference 5. While various distortion scales for use when a codebook is searched for a codevector are known, here a squared distance between LSP parameters is used. Such squared distance between LSP parameters is given by the following equation:

$$D_1 = \sum_{i=1}^{P} \{LSP(i) - LSP'_j(i)\}^2 \qquad (7)$$

where LSP(i) are input ith LSP coefficients, P is an order number of the LSP parameters, and $LSP'_j(i)$ are jth codevectors the codebook 120 has, and for j=1 to $2^B$, where B is a bit number of the codebook 120. The vector quantizer 110 outputs a codevector, which minimizes the equation (7) above, to a subtractor 130. Here, the vector quantizer 110 may select a single codevector which minimizes the equation (7) or select a plurality of codevectors which minimize the equation (7) in order of magnitude from the minimum one. Further, the vector quantizer 110 outputs an index or indices j representative of the selected codevector or codevectors to a scalar quantizer 140 and a terminal 155.

The subtractor 130 subtracts the selected codevector from the input LSP parameter to find a residual signal e(1) in accordance with the following equation (8) and outputs it to the scalar quantizer 140:

$$e(i) = LSP(i) - LSP'_j(i)$$

The scalar quantizer 140 measures in advance for each order number i a distribution range of residual signals calculated by the subtractor 130 for each of predetermined M codevectors ($M \leq 2^B$, where B is a bit number of the codebook 120) determined at the codebook 120 in advance. A detailed measuring method of such distribution range is disclosed, for example, in reference 4. Further, the scalar quantizer 140 changes over the distribution range using the index j received from the vector quantizer 110 and scalar quantizes the residual signal e(1) using a bit number determined in advance for each order number i. The results of such scalar quantization are outputted to a terminal 145.

Figure 7:
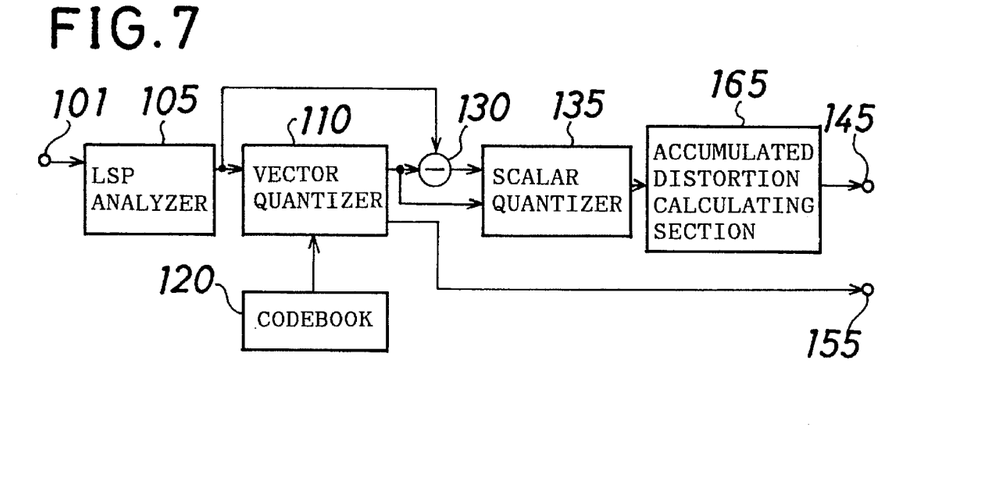
FIG. 7 is a similar view showing a modification to the speech parameter coding system of FIG. 6.

Referring now to FIG. 7, there is shown a modification to the speech parameter coding system of FIG. 6. The modified speech parameter coding system is different from the speech parameter coding system of FIG. 6 in that it includes a different scalar quantizer 35 in place of the scalar quantizer 140 and additionally includes an accumulated distortion calculating section 165.

In particular, the scalar quantizer 135 measures in advance an existing range of an output residual signal e(i) of the subtractor 130 for each order number i. Further, the residual signal e(i) is scalar quantized in the following manner. In particular, a quantizing range is determined as a maximum and a minimum of an existing range determined for each order number i, and the distance between the maximum and minimum is divided by a predetermined level number L. Here, $L = 2^B$. Then, for each order number, a quantizing distortion is calculated for a quantizing value for scalar quantization in accordance with the following equation, and then, M candidates ($M \leq L$ here) are determined in order of magnitude of quantizing distortion from the minimum one:

$$D_{SQM}(i) = [e(i) - e'_M(i)]^2 \qquad (9)$$

where $e'_M(i)$ is the Mth candidate for a quantizing value outputted from the scalar quantizer 135. As well known from reference 4 and so forth, the existing range of LSP parameters is most overlapped among different order numbers. Further, the following expression always stands with regard to the order of LSP parameters:

$$LSP(1) < LSP(2) < LSP(3) < \ldots < LSP(10) \qquad (10)$$

Making use of the characteristics, the quantizing range of the scalar quantizer 135 for the i-1th order is limited in the following manner using the quantizing value $e'_M(i)$ at the ith order.

In particular, if a maximum value of an existing range of LSP parameters at the i-1th order is greater than a vector-scalar quantizing value of an LSP parameter at the ith order, then the maximum value is set as a vector-scalar quantizing value at the ith order.

A residual signal is thus scalar quantized with a predetermined number of bits for each order number by limiting a quantizing range using the method described just above.

The accumulated distortion calculating section 165 calculates an accumulated distortion for each order number obtained by accumulation of quantizing distortions calculated for the individual candidates of scalar quantizing value in accordance with the following equation:

$$D_k = \sum_{i=1}^{P} D_{SQ}(i) \qquad (11)$$

Further, the accumulated distortion calculating section 165 calculates a candidate which minimizes an accumulated distortion for each order number, and outputs scalar quantizing values then by way of the output terminal 145.

Figure 8:
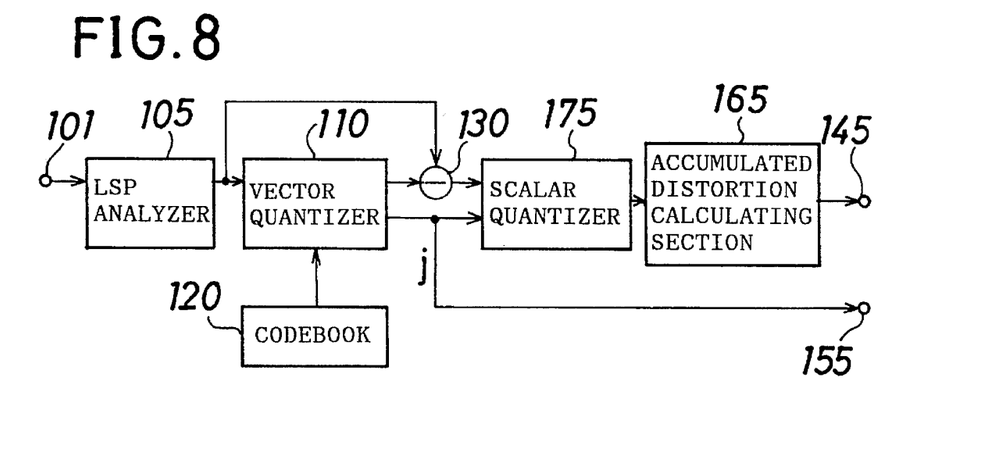
FIG. 8 is a similar view but showing a modification the modified speech parameter coding system of FIG. 7.

Referring now to FIG. 8, there is shown a modification to the speech parameter coding system shown in FIG. 7. The modified speech parameter coding system is different from the speech parameter coding system of FIG. 7 in that it includes a different scalar quantizer 175 in place of the scalar quantizer 135. The scalar quantizer 175 measures in advance for each order number i a distributing range of a residual signal calculated by the subtractor 130 for each of M codevectors ($M < 2^B$, where B is a bit number of the codebook 120) determined in advance at the codebook 120. Further, the scalar quantizer 175 changes over the distributing range using an index j received from the vector quantizer 110 and scalar quantizes the residual signal e(i) using a bit number determined in advance for each order number i. Further, when scalar quantization is performed each order number of the residual signal, similarly as in the speech parameter coding system of FIG. 7, a plurality of candidates of quantizing value are determined for the ith order, and the quantizing range for scalar quantization for the i-1th order is limited using the candidates, whereafter quantizing distortions are accumulated for each of the candidates, and then a quantizing value which minimizes the accumulated distortion is found for each quantizing value order number and outputted by way of the terminal 145.

It is to be noted that some other well-known distance scale such as a weighted distance may be employed alternatively for the search of the codebook 120 described above.

Figure 9:
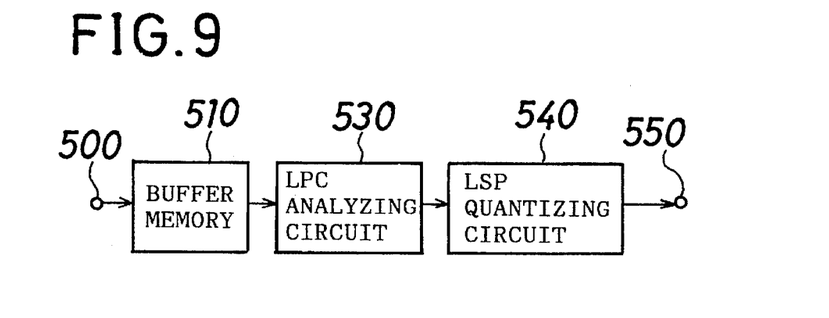
FIG. 9 is a similar view but showing a different speech parameter coding system to which the present invention is applied.

Referring now to FIG. 9, there is shown a yet further speech parameter coding system to which the present invention is applied. The speech parameter coding system shown receives an input speech signal by way of an input terminal 500 and stores the speech signal for one frame (for example, 20 ms) into a buffer memory 510.

An LPC analyzing circuit 530 performs a well-known LPC analysis from the speech signal of a frame to calculate a number of LSP parameters equal to a predetermined order number P as parameters which represent spectrum characteristics of the speech signal of the frame.

An LSP quantizing circuit 540 quantizes the LSP parameters found for the frame with a predetermined quantizing number of bits and outputs a thus found code $l_K$ by way of an output terminal 550.

Figure 10:
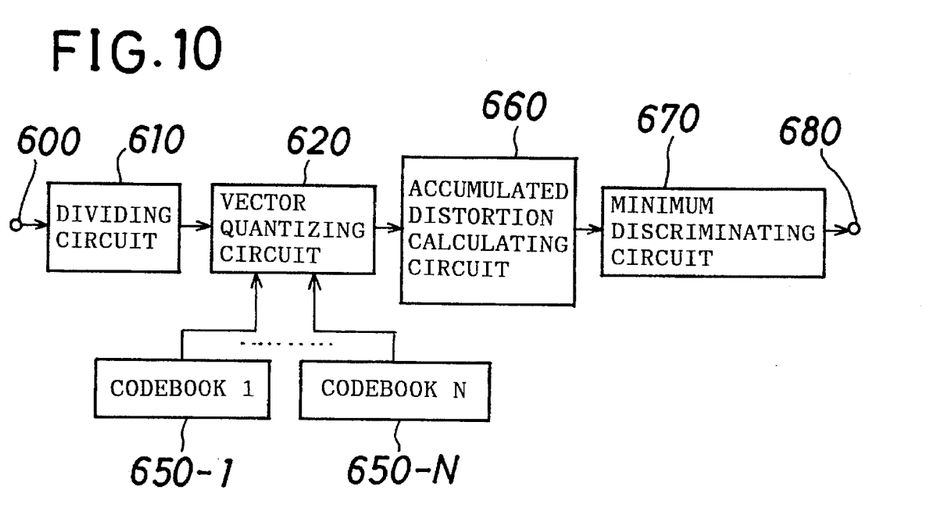
FIG. 10 is a block diagram showing an LSP quantizing circuit of FIG. 9.

FIG. 10 shows detailed construction of the LSP quantizing circuit 540. Referring to FIG. 10, the LSP quantizing circuit 540 receives Pth-order LSP parameters of a frame by way of an input terminal 600. The input Pth-order LSP parameters are divided for each Kth-order LSP parameters (K<P) by a dividing circuit 610, and each such Kth-order LSP parameters are outputted to a vector quantizing circuit 620. The vector quantizing circuit 620 constructs in advance N codebooks 650-1 to 650-N corresponding to the dividing number N at the dividing circuit 610 for each Kth-order LSP parameters. The codebooks 650-1 to 650-N are each constituted from a number of codevectors depending upon a predetermined bit number. Further, the codebooks 650-1 to 650-N are constructed such that, as described hereinabove, they may represent difference values between LSP parameters at different order numbers. The vector quantizing circuit 620 calculates a quantizing distortion for each Kth-order LSP parameters beginning with the first order LSP parameter and outputs M candidates of codevector in order of magnitude of quantizing distortion from the minimum for each Kth-order LSP parameters. For example, after M candidates are produced for the first Kth-order LSP parameters, LSP parameters are represented, for the next Kth-order LSP parameters, using the codebook 650-2 in accordance with the equation (1) given hereinabove using each of the M candidates as an initial value, and then quantizing distortions are calculated in accordance with the equation (2) given hereinabove, whereafter M candidates are found in order of magnitude of quantizing distortion from the minimum one. After then, such processing will be repeated by a number of times equal to the dividing number N.

An accumulated distortion calculating circuit 660 calculates accumulated distortions for all possible combinations of the M codevectors outputted for each Kth-order LSP parameters in accordance with the equation (3) given hereinabove.

A minimum discriminating circuit 670 finds a combination of candidates which minimizes the accumulated distortion, and outputs a combination of indices of the codevectors then by way of a terminal 680.

Figure 11:
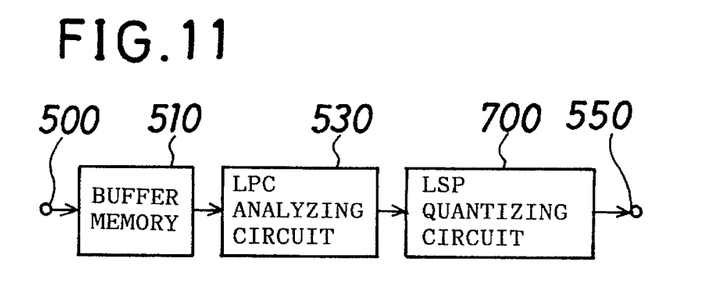
FIG. 11 is a block diagram showing a modification to the speech parameter coding system of FIG. 9.

Referring now to FIG. 11, there is shown a modification to the speech parameter coding system shown in FIG. 9 in that it includes a different LSP quantizing circuit 700 in place of the LSP quantizing circuit 540.

Figure 12:
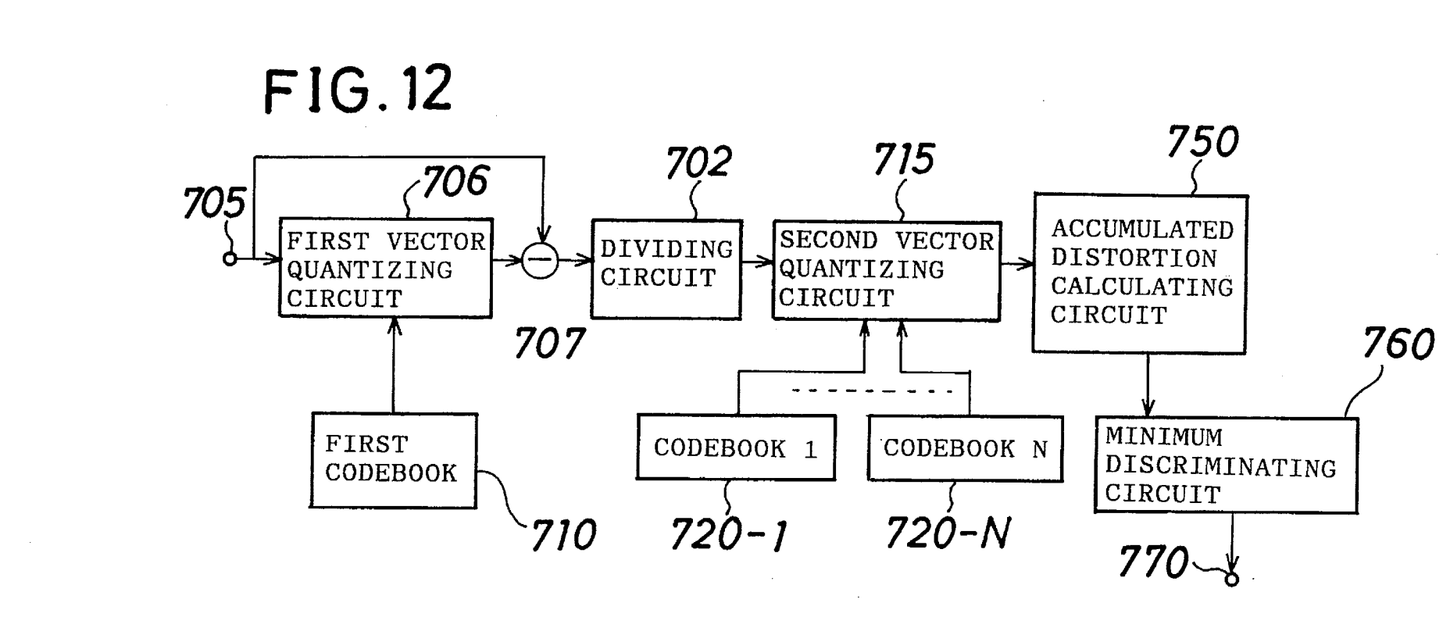
FIG. 12 is a block diagram showing an LSP quantizing circuit of the speech parameter coding system of FIG. 11.

FIG. 12 shows details of the LSP quantizing circuit 700. Referring to FIG. 12, the LSP quantizing circuit 700 receives Pth-order spectrum parameters by way of a terminal 705. The input Pth-order spectrum parameters are quantized by a first vector quantizing circuit 706 using a first codebook 710 which is constructed by learning in advance. The first vector quantizing circuit 706 calculates a distortion of the equation (2) given hereinabove for each of codevectors of the codebook 710 and outputs M candidates in order of magnitude of distortion from the minimum one. A subtractor 707 calculates an error signal between each of the M candidates and the input spectrum parameter and outputs it to a dividing circuit 702. The dividing circuit 702 calculates the Pth-order error signals for each predetermined Kth-order spectrum parameters (K<P). A second vector quantizing circuit 715 vector quantizes the error signals for each Kth-order spectrum parameters using second codebooks 720-1 to 720-N which are constructed such that they may represent differences between spectrum parameters at different order numbers for each Kth-order spectrum parameters. Here, the equations (1) and (2) given hereinabove are used for the calculation of distortions. Further, the second vector quantizing circuit 715 outputs, for each Kth-order spectrum parameters, M codevectors in order of magnitude of distortion of the equation (2) from the minimum one as candidates. Detailed operation of the second vector quantizing circuit 715 is similar to that of the vector quantizing circuit 620 of FIG. 10.

An accumulated distortion calculating circuit 750 accumulates quantizing distortions for all possible combinations of the M candidates outputted from the first vector quantizing circuit 706 and the candidates outputted from the second vector quantizing circuit 715 for each Kth-order spectrum parameters to calculate accumulated distortions. A minimum discriminating circuit 760 finds a combination of candidates which minimizes the accumulated distortion, and outputs a combination of indices representative of codevectors via a terminal 770.

Figure 13:
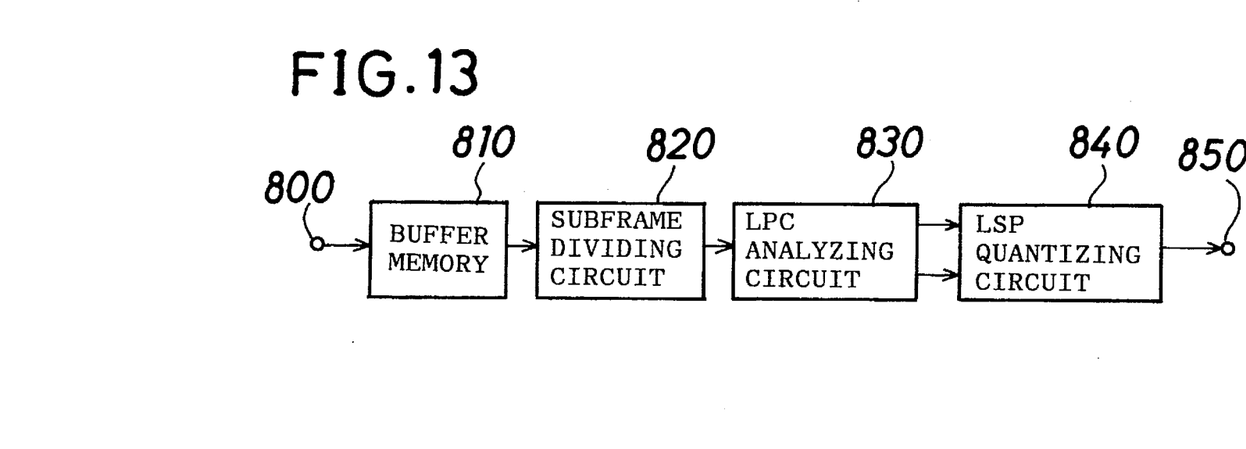
FIG. 13 is a block diagram showing another different speech parameter coding system to which the present invention is applied.

Referring now to FIG. 13, there is shown a yet further speech parameter coding system to which the present invention is applied. The speech parameter coding system receives an input speech signal by way of an input terminal 800 and stores the speech signal for one frame (for example, 30 to 40 ms) into a buffer memory 810.

A subframe dividing circuit 820 divides the speech signal of each frame into a predetermined plurality of subframes (for example, 5 to 8 ms).

Figure 4:
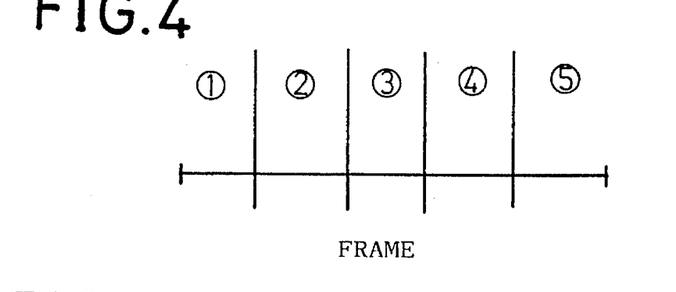
FIG. 4 is a diagrammatic view illustrating a relationship between a frame and subframes of a speech signal.

An LPC analyzing circuit 830 performs a well-known LPC analysis from the speech signal of the frame to calculate a number of LSP parameters equal to a predetermined order number P as parameters which represent spectrum characteristics of the speech signal at predetermined subframe positions (for example, the second and fourth positions in FIG. 4). Details of such calculation are disclosed, for example, in reference 4 mentioned hereinabove.

An LSP quantizing circuit 840 quantizes the LSP parameters calculated for the frame with a predetermined number of quantizing bits and outputs the thus calculated codes $l_K$ through an output terminal 850. The following description proceeds on the assumption that vector quantization of the dividing type is performed as vector quantization which can be realized with a small amount of calculations and a small memory by the LSP quantizing circuit 840.

Figure 14:
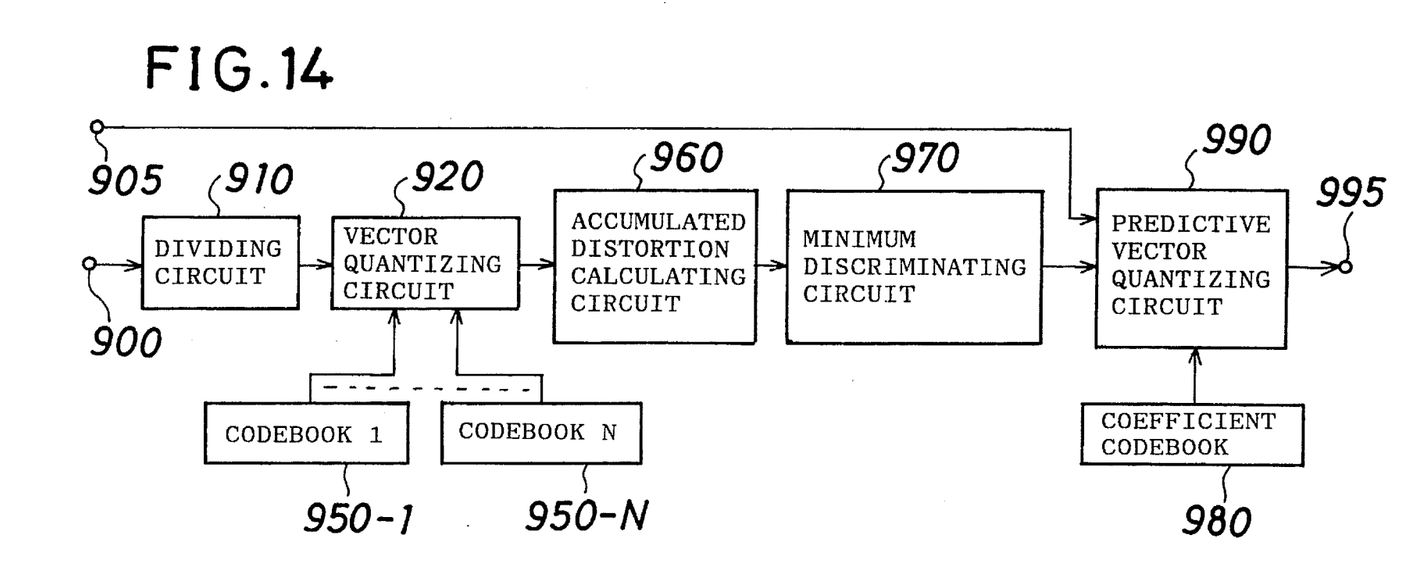
FIG. 14 is a block diagram showing an LSP quantizing circuit of FIG. 13.

FIG. 14 shows detailed construction of the LSP quantizing circuit 840. Referring to FIG. 14, the LSP quantizing circuit 840 receives LSP parameters of a frame by way of an input terminal 900.

A dividing circuit 910 receives such Pth-order input LSP parameters and divides them for each Kth-order LSP parameters (K<P) and then outputs such LSP parameters for each Kth-order LSP parameters to a vector quantizing circuit 920. The vector quantizing circuit 920 constructs in advance for each Kth-order LSP parameters N codebooks 950-1 to 950-N corresponding to the dividing number N at the dividing circuit 910. The codebooks 950-1 to 950-N are each constituted from a number of codevectors ($2^L$) depending upon a predetermined bit number L. Further, the codebooks 950-1 to 950-N are constructed such that they may represent difference values between LSP parameters at different order numbers. The ith spectrum parameter can be represented in the following equation using a codevector included in any of the codebooks 950-1 to 950-N:

$$\omega'_i = \omega'_{i-1} + \Delta\omega'_i \quad (12)$$

The codebooks 850-1 to 850-N are constructed by learning difference values between LSP parameters at different order numbers as training signals for spectrum parameters for a predetermined order number. Such learning method is disclosed, for example, in reference 5 mentioned hereinabove.

The vector quantizing circuit 920 further calculates a quantizing distortion for each Kth-order LSP parameters in accordance with the following equation:

$$D = \sum_i [\omega_i - \omega'_{ij}]^2 \quad (13)$$

where $\omega_i$ is the input ith LSP parameter, and $\omega'_{ij}$ is the ith LSP parameter represented using the jth codevector of the ith codebook. The vector quantizing circuit 920 calculates quantizing distortions for each Kth-order LSP parameters beginning with the first order LSP parameter in accordance with the mentioned equation (5) and outputs M candidates of codevector in order of magnitude of quantizing distortion from the minimum one for each Kth-order LSP parameters. For example, after M candidates are produced for the first Kth-order LSP parameters, the LSP parameters are represented, for the next Kth-order LSP parameters, using the codebook 950-2 in accordance with the equation (4) using each of the M candidates as an initial value, and quantizing distortions are found in accordance with the equation (5), after which M candidates are found in order of magnitude of quantizing distortion from the minimum one. Thereafter such processing is repeated a number of times equal to the dividing number N described hereinabove.

An accumulated distortion calculating section 960 calculates accumulated distortions for all possible combinations of the M codevectors outputted for each Kth-order LSP parameters in accordance with the following equation:

$$E = \sum_{i=1}^{N} D_i \quad (14)$$

A minimum discriminating circuit 970 finds a combination of candidates which minimizes the accumulated distortion E, and outputs a combination of codevectors then.

A predictive vector quantizing circuit 990 predicts an LSP parameter sequence of the other subframe received by way of a terminal 905 using the output codevector of the minimum discriminating circuit 970 and a coefficient codebook 980, and calculates predictive quantizing distortions in accordance with the equation (5). Then, the predictive vector quantizing circuit 990 finds a coefficient codevector which minimizes the equation (5), and outputs the coefficient codevector and the output codevector of the minimum discriminating circuit 970 as quantized values of spectrum parameters of the two subframes.

Figure 15:
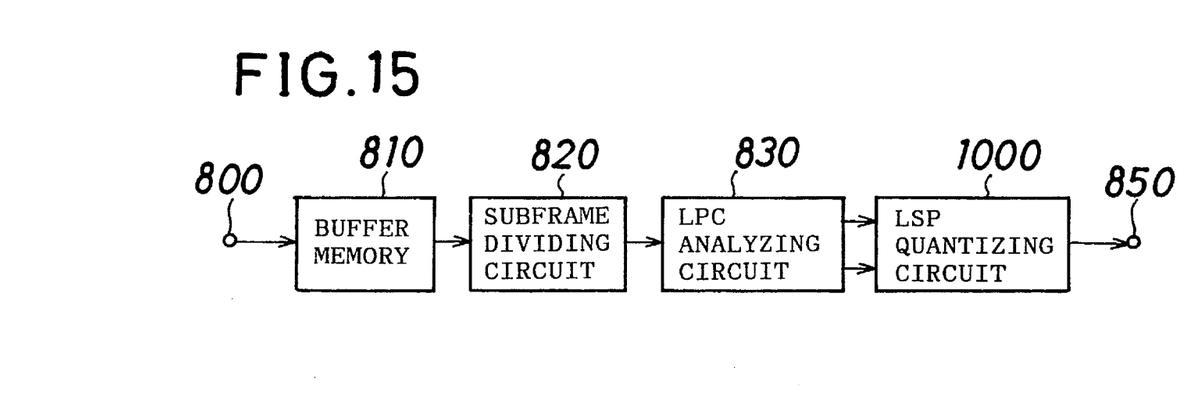
FIG. 15 is a block diagram showing a modification to the speech parameter coding system of FIG. 13.

Referring now to FIG. 15, there is shown a modification to the speech parameter coding system of FIG. 13 in that it includes a different LSP quantizing circuit 1000 in place of the LSP quantizing circuit 840.

Figure 16:
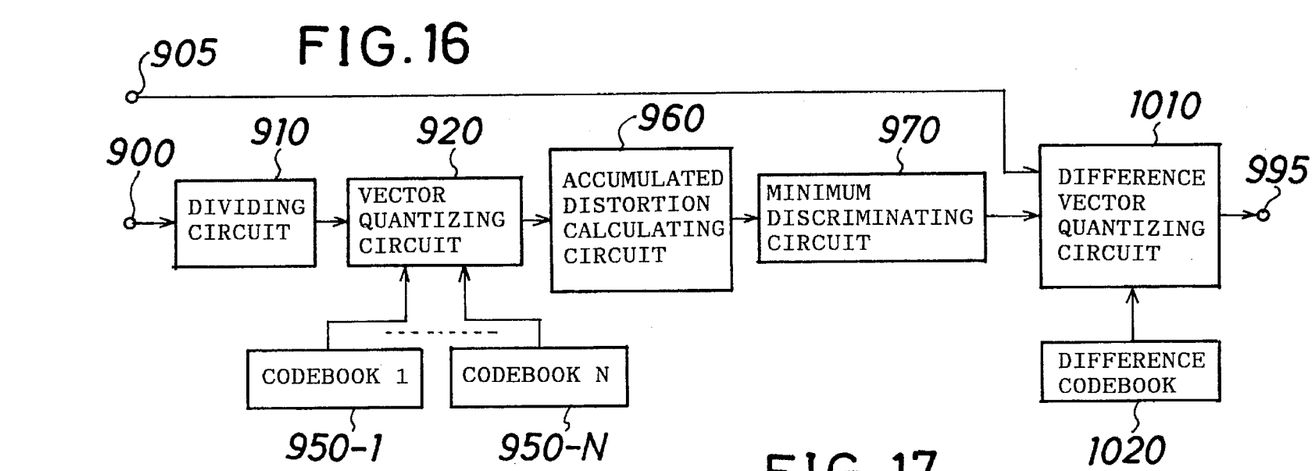
FIG. 16 is a block diagram showing an LSP quantizing circuit of FIG. 15.

Detailed construction of the LSP quantizing circuit 1000 is shown in FIG. 16. Referring to FIG. 16, the LSP quantizing circuit 1000 is a modification to the LSP quantizing circuit 840 shown in FIG. 14 in that it includes a difference vector quantizing circuit 1010 and a difference codebook 1020 in place of the predictive vector quantizing circuit 990 and the coefficient codebook 980, respectively. In particular, the difference vector quantizing circuit 1010 calculates difference signals between an LSP parameter sequence of the other subframe inputted by way of the terminal 905 and an output of the minimum discriminating circuit 970 in accordance with the equation (6), and then performs vector quantization of the difference signals using the difference codebook 1020. Thus, the difference vector quantizing circuit 1010 outputs a codevector which minimizes the quantizing distortion and the output codevector of the minimum discriminating circuit 970.

Figure 17:
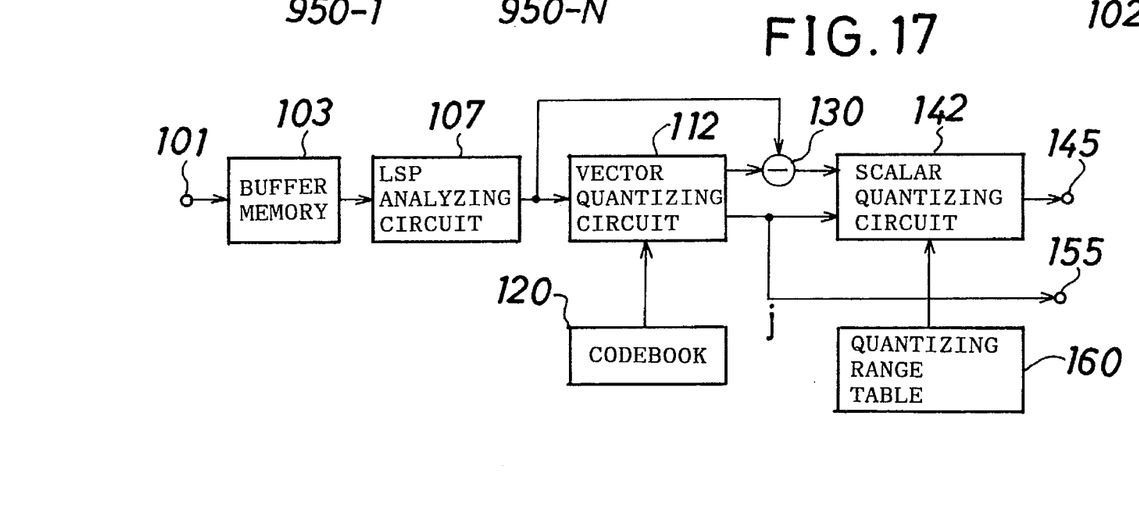
FIG. 17 is a block diagram showing a further different speech parameter coding system to which the present invention is applied.

Referring now to FIG. 17, there is shown a yet further speech parameter coding system to which the present invention is applied. The speech parameter coding system receives an input speech signal by way of an input terminal 101 and stores the input speech signal for one frame (for example, 40 ms) into a buffer memory 103. An LSP analyzing circuit 107 performs a well-known LPC analysis to find LSP coefficients as spectrum parameters.

A vector quantizing circuit 112 vector quantizes the input LSP parameters using a codebook 120. The codebook 120 is constructed by learning in advance using a large amount of LSP parameter sequence for the training. While various distortion scales in searching for a codevector are known, here a squared distance between LSP parameters is used. The vector quantizing circuit 112 finds a codevector which minimizes the equation (7), and outputs it to a subtracting circuit 130. Here, the vector quantizing circuit 112 may select a single codevector which minimizes the equation (7) or select a plurality of codevectors which minimize the equation (7) in order of magnitude from the minimum one. Further, the vector quantizing circuit 112 outputs an index j representative of the selected codevector to a scalar quantizing circuit 142 and a terminal 155.

The subtracting circuit 130 subtracts the value of the selected codevector from the input LSP parameters to find residual signals e(1) in accordance with the equation (8) and outputs them to the scalar quantizing circuit 142.

The scalar quantizing circuit 142 measures in advance for each order number i a distribution range of residual signals calculated by the subtracting circuit 130 for each of M codevectors (M<$2^B$, where B is a bit number of the codebook 120) determined at the codebook 120 in advance, and stores such distribution ranges into a quantizing range table 160. Further, the scalar quantizing circuit 142 changes over the distribution range of the quantizing range table 160 using the index j received from the vector quantizing circuit 112 and scalar quantizes the residual signals e(i) using a bit number determined in advance for each order number i. The results of such scalar quantization are outputted to a terminal 145.

Figure 18:
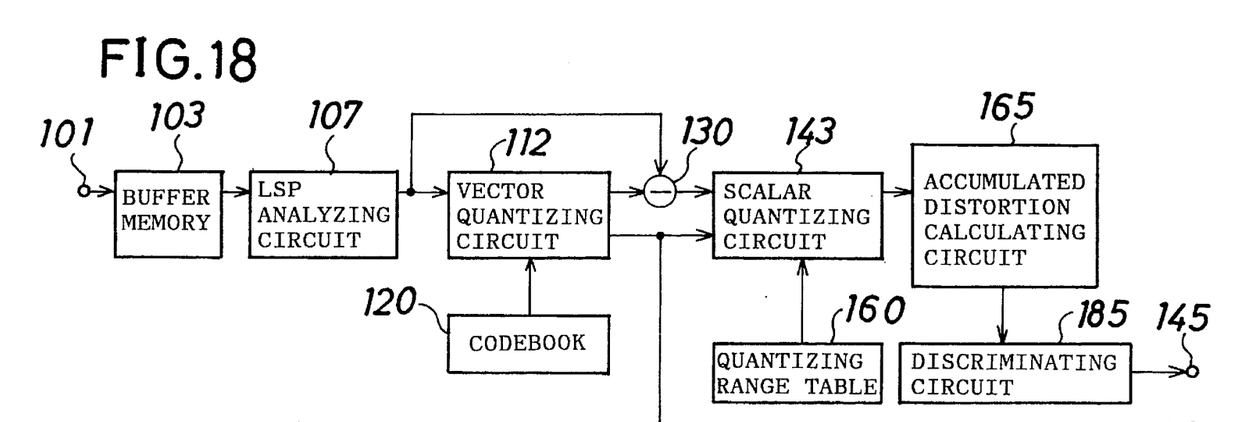
FIG. 18 is a similar view but showing a modification to the speech parameter coding system of FIG. 17.

Referring now to FIG. 18, there is shown a modification to the speech parameter coding apparatus of FIG. 17 in that it includes a different scalar quantizing circuit 143 in place of the scalar quantizing circuit 142 and additionally includes an accumulated distortion calculating circuit 165 and a discriminating circuit 185.

In particular, the scalar quantizing circuit 143 measures in advance for each order number i an existing range of output residual signals e(i) of the subtracting circuit 130 and stores such existing ranges into the quantizing range table 160. As described hereinabove, the scalar quantizing circuit 143 calculates a quantizing distortion for each of quantizing values for the scalar quantization, finds M candidates (here, M<L) in order of magnitude of quantizing distortion from the minimum one, and outputs quantizing distortion values for the individual candidates to the accumulated distortion calculating circuit 165. Then, the scalar quantizing circuit 143 limits the quantizing ranges using the values of the candidates as described hereinabove and scalar quantizes the residual signals for each order number with a predetermined number of bits.

The accumulated distortion calculating circuit 165 calculates an accumulated distortion wherein the quantizing distortions found for each of the candidates of scalar quantizing value are accumulated for each order number, in accordance with the equation (11) given hereinabove.

The discriminating circuit 185 finds a candidate which minimizes the accumulated distortion for each order number, and outputs a scalar quantizing value then by way of the terminal 145.

Figure 19:
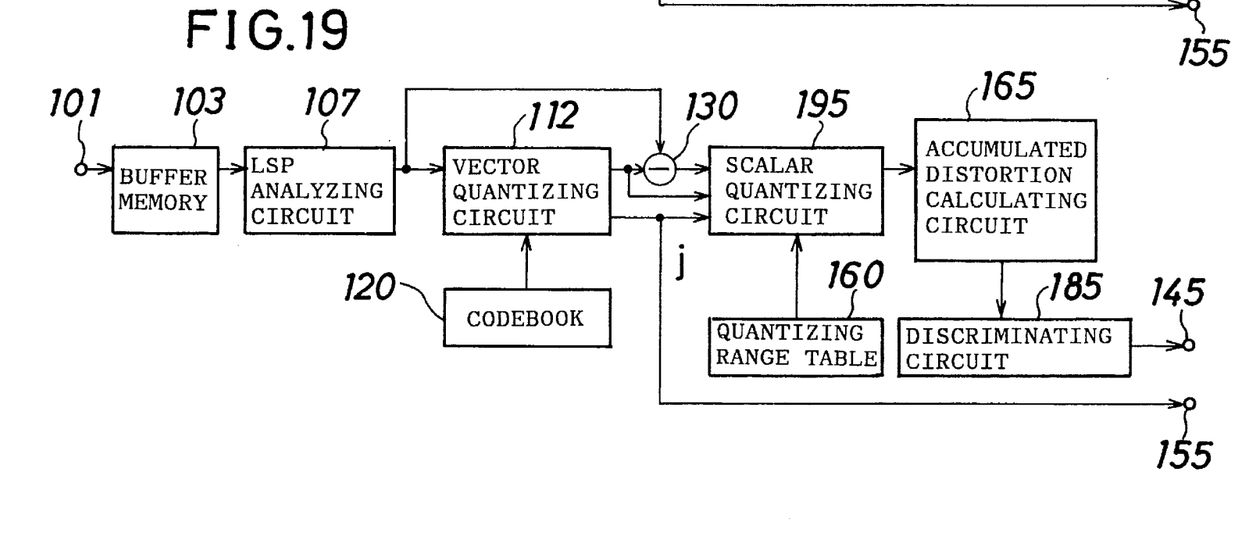
FIG. 19 is a similar view but showing a modification to the modified speech parameter coding system of FIG. 18.

Referring now to FIG. 19, there is shown a modification to the modified speech parameter coding apparatus of FIG. 18 in that it includes a different scalar quantizing circuit 195 in place of the scalar quantizing circuit 143.

In particular, the scalar quantizing circuit 195 measures in advance for each order number i a distribution range of residual signals calculated by the subtractor 130 for each of M codevectors (M<$2^B$, where B is a bit number of the codebook 120) determined at the codebook 120 in advance, and stores such distribution ranges into the quantizing range table 160. Further, the scalar quantizing circuit 195 changes over the quantizing range using the index j received from the vector quantizing circuit 112 and scalar quantizes the residual signals e(i) using a bit number determined in advance for each order number i. Then, the scalar quantizing circuit 195 calculates, when scalar quantization is to be performed for each order number of the residual signals, a plurality of candidates of quantizing value for the ith order, limits the quantizing range of scalar quantization for the i-ith order using the candidates and performs scalar quantization of each of the candidates, similarly as described hereinabove.

The accumulated distortion calculating circuit 165 accumulates a quantizing distortion for each of the candidates in the quantizing range for each order number.

The discriminating circuit 185 finds a quantizing value which minimizes the accumulated distortion for each order number, and outputs such quantizing values by way of the terminal 145.

Various modifications may be made to the speech parameter coding systems described above.

For example, while an LSP parameter is used as a spectrum parameter of a speech signal in the speech parameter coding systems described above, any other known parameter such as, for example, a PARCOR, LAR or cepstrum parameter may be used alternatively.

Further, for the searching for a codevector of an LSP parameter, any other known distance scale than such squared distance between LSP parameters represented by the equation (2) given hereinabove may be used alternatively. For example, a perceptual weighted squared distance is known as one of such distance scales and disclosed, for example, in Honda, "Vector Quantization of LPC Parameters Using Weighted Logarithmic Spectral Distortion Scale", *Lecture Thesis Collection of Acoustical Society*, pp. 195–196, October, 1990 (reference 8).

Further, while, in the speech parameter coding system of FIGS. 9 and 11 described above, Pth-order parameters are divided uniformly for each Kth-order parameters by the dividing circuit, they may otherwise be divided non-uniformly.

Further, while, in the speech parameter coding system of FIG. 11, two vector quantizers are used for the vector quantization of LSP coefficients of a frame, any other suitable number of vector quantizers can otherwise be used.

Further, while, in the speech parameter coding systems of FIGS. 9 and 11, M candidates are found for each division or for vector quantization by each vector quantizer, this will result in exponential increase of the number of candidates for all order numbers or for all stages. For example, vector quantization by three stages involves a total of $M^2$ candidates. Thus, if an accumulated distortion is found, in vector quantization at the second or following division or at the second or following stage, for each stage and then the accumulated distortions are trimmed to select a predetermined fixed number (for example, M) of candidates for each stage in order of magnitude of accumulated distortion from the minimum one, then the total number of candidates is M for each stage and for all stages, and consequently, the number of candidates is prevented from increasing exponentially. Where such method is employed, the amount of calculation can be reduced remarkably compared with the method employed in the speech parameter coding systems, but the performance is somewhat deteriorated.

Further, a candidate need not be found by the vector quantizers at all stages or at all divisions and alternatively, a plurality of candidates may be found by vector quantizers at a predetermined number of stages.

Further, the learning method of a codebook representative of differences of spectrum parameters when vector quantization is performed for each Kth-order parameters may be any other learning method than that described hereinabove. For example, learning may be performed coding a training signal with a codebook $\Delta\omega'_l$ so that an error power given by the following equation or a weighted error power may be minimized:

$$D = \sum_i [\omega_i - \{\omega'_{i-1} + \Delta\omega'_i\}]^2 \qquad (15)$$

Further, an optimum combination of candidates may be selected using any other well-known high speech calculating method such as, for example, a dynamic programming method.

Further, while a vector quantizer of the all search type is used for the vector quantizer, any other well-known vector quantizer of a different construction such as of the tree search type, lattice type or multi-stage type may alternatively be used in order to reduce a total amount of calculation required for the searching for a codevector. Details of such calculation amount reducing techniques are disclosed, for example, in Gray, "Vector Quantization", *IEEE ASSP Magazine*, pp. 4–29, 1984 (reference 9).

It is to be noted that, while the codebooks 1 to N in the speech parameter coding systems of FIGS. 9 and 11 represent differences between LSP parameters at different order numbers, they may otherwise represent LSP parameters directly as they are.

Further, the speech parameter coding system of FIG. 13 or 15 may be modified such that the minimum discriminating circuit 970 of the LSP quantizing circuit 840 or 1000 is displaced to a location subsequent to the predictive quantizing circuit 990 or difference vector quantizing circuit 1010 such that predictive vector quantization or difference vector quantization is performed for each of candidates outputted from the vector quantizing circuit 920, and then an accumulated distortion for each candidate found by the accumulated distortion calculating circuit 960 and a quantizing distortion caused by such predictive vector quantization or difference vector quantization are added to find a total distortion, whereafter a set of codevectors which minimize the total distortion and a predictive codevector or a difference codevector are selected by the minimum discriminating circuit 970. While such modification increases a total amount of calculation, it will result in improvement in characteristic.

Further, any other well-known method may be employed for the vector quantization by the vector quantizing circuit 920. For example, multi-stage vector quantization wherein a plurality of codebooks are connected in cascade connection at a plurality of stages and the divisional vector quantization described hereinabove may be combined.

Further, while the vector quantizing circuit 920 finds M candidates by vector quantization for each division, this will result in an exponential increase of the number of candidates for all order numbers or for all stages. For example, vector quantization for three divisions involves a total of Me candidates. Thus, if an accumulated distortion is found, in vector quantization at the second or following division, for each stage and then the accumulated distortions are trimmed to select a predetermined fixed number of (for example, M) candidates for each stage in order of magnitude of accumulated distortion from the minimum one, then the total number of candidates is M as a whole, and consequently, the number of candidates is prevented from increasing exponentially. Where such method is employed, the amount of calculation can be reduced remarkably compared with the method employed in the speech parameter coding system, but the performance is somewhat deteriorated.

Further, a candidate need not be found at all divisions and alternatively, a plurality of candidates may be found by vector quantizers at a predetermined division or divisions.

Further, the learning method of a codebook representative of differences of spectrum parameters when vector quantization is performed for each Kth-order parameters may be any other learning method than that described hereinabove. For example, learning may be performed coding a training signal with a codebook $\Delta\omega'_i$ in accordance with a closed loop method so that an error power given by the following equation or a weighted error power may be minimized:

$$D = \sum_i [\omega_i - \{\omega'_{i-1} + \Delta\omega'_i\}]^2 \quad (16)$$

Further, instead of learning a codebook and a predictive coefficient or difference codebook independently of each other, learning of such codebooks may be repeated alternately using a training signal in order to perform optimal learning.

Further, while the dividing circuit 910 of the speech parameter coding system of FIG. 15 divides LSP parameters uniformly for each Kth-order parameters, the LSP parameters may otherwise be divided non-uniformly.

Further, an optimum combination of candidates may be selected using any other well-known high speed calculating method such as, for example, a dynamic programming method.

Further, while a predictive coefficient codebook is produced for each subframe in the speech parameter coding system of FIG. 13, alternatively a matrix codebook wherein a codebook is produced collectively for a plurality of subframes may be employed. Production of such matrix codebook is disclosed, for example, in C. Tsao et al., "Matrix Quantizer Design for LPC Speech Using the Generalized Lloyd Algorithm", *IEEE Trans. ASSP*, pp. 537–545, 1985 (reference 10). With the construction which employs a matrix codebook, since a plurality of subframes are represented collectively in codevectors, the number of bits required for predictive coefficient codevector transmission can be decreased.

Further, the speech parameter coding system of FIG. 15 may otherwise use a value other than 1 for B of the equation (6). Further, such B may be included in a codebook such that an optimum coefficient may be selected from within the codebook.

Further, the distance scale in vector quantization or the distance scale in scalar quantization may be any other suitable well-known distance scale than the squared distance such as, for example, a weighted distance scale, a cepstrum distance scale or a melcepstrum distance scale.

Further, while spectrum parameters are calculated for a speech signal for a frame, a frame may be divided into a plurality of shorter subframes and spectrum parameters may be calculated for a predetermined one or ones of such subframes to effect vector-scalar quantization of them.

Further, any of the speech parameter coding systems of FIG. 17 to 19 may be modified such that, when a predetermined order number of quantizing ranges for scalar quantization are determined for a predetermined number of codevectors for vector quantization, a quantizing range may be measured for each of all codevectors ($2^s$) or for each of a smaller number of codevectors. Or else, different quantizing ranges may be determined for each codevector, or a common quantizing range may be determined for several codevectors. Further, when a quantizing range is measured, such measurement may be performed for spectrum parameters of all orders, or else, such measurement may be performed for a smaller order number of spectrum parameters while a predetermined quantizing range or ranges are provided for the other order number spectrum parameters.

Further, a frame may be divided into a plurality of shorter subframes such that the present invention is applied to one of the subframes to quantize a spectrum parameter while at least one of the other subframes is represented using quantized values of spectrum parameters of the frame, quantized values of spectrum parameters of a frame or frames in the past and interpolation coefficients or an interpolation coefficient codebook.

Having now fully described the invention, it will be apparent to one of ordinary skill in the art that many changes and modifications can be made thereto without departing from the spirit and scope of the invention as set forth herein.

What is claimed is:

1. A speech parameter coding method, comprising the steps of:

receiving an input speech signal;

dividing the received speech signal into a plurality of frames each of a predetermined time length;

finding spectrum parameters, each of which corresponds to first to P-th order, of the speech signal for each of the frames;

dividing the spectrum parameters into a plural number of said spectrum parameters in accordance with their orders;

searching a spectrum codebook for the divided spectrum parameters and calculating a distortion due to quantizing by use of codevectors in said codebook to obtain a plurality of candidate codevectors.

2. A speech parameter coding method, comprising the steps of:

receiving an input speech signal;

dividing the received speech signal into a plurality of frames;

finding spectrum parameters, each of which corresponds to first to P-th order, of the speech signal for each of the frames;

representing the spectrum parameters in a multi-stage cascade connection of a plurality of codebooks;

obtaining a plurality of candidate codevectors at at least one of stages of the multi-stage cascade connection;

dividing, at the other stage or at at least one of the other stages of the multi-stage cascade connection, the spectrum parameters into a plural member of said spectrum parameters in accordance with their orders;

searching other codebooks for the divided spectrum parameters to obtain a plurality of candidates of codevectors; and selecting a combination of codevectors which minimizes an accumulated distortion thereby to quantize the spectrum parameters.

3. A speech parameter coding method, comprising the steps of:

receiving an input speech signal;

dividing the input speech signal into a plurality of frames;

dividing each of the frames into a plurality of shorter subframes;

finding spectrum parameters, each of which corresponds to first to P-th order, for the speech signal of at least one of the subframes;

quantizing the spectrum parameters of at least one of the subframes using a first codebook constructed in advance; and quantizing parameters of the other subframe or at least of the other subframes using the quantized values and a second codebook constructed in advance or non-linear processing.

4. A speech parameter coding method, comprising the steps of:

receiving an input speech signal;

dividing the input speech signal into a plurality of frames;

dividing each of the frames into a plurality of shorter subframes;

finding spectrum parameters, each of which corresponds to first to P-th order, for the speech signal of at least one of the subframes;

quantizing the spectrum parameters of at least one of the subframes using a first codebook constructed in advance;

finding difference signals between the spectrum parameters of the other subframe or at least one of the other subframes and the quantized values; and quantizing the difference signals using a second codebook constructed in advance.

5. A speech parameter coding apparatus, comprising:

means for dividing an input speech signal into a plurality of frames;

means for finding spectrum parameters, each of which corresponds to first to P-th order, from the speech signal;

means for vector quantizing the spectrum parameters to obtain vector quantized values;

means for scalar quantizing difference signals between the spectrum parameters and the vector quantized values; and means for determining a predetermined order of quantizing ranges for the scalar quantization for each of a predetermined number of codevectors of said vector quantizing means so as to cause said scalar quantizing means to perform scalar quantization within the quantizing ranges.

6. A speech parameter coding apparatus, comprising:
means for dividing an input speech signal into a plurality of frames;

means for finding a predetermined order number of spectrum parameters from the speech signal;

means for vector quantizing the spectrum parameters;

means for scalar quantizing difference signals between the spectrum parameters and the vector quantized values;

means for producing a plurality of candidate quantizing values for each order number of the spectrum parameters at said scalar quantizing means;

means for modifying, using each of the candidates, a quantizing range of an adjacent spectrum parameter; and means for accumulating a predetermined order number of quantizing distortions by the quantized values and producing a quantized value sequence which minimizes the accumulated distortion.

7. A speech parameter coding apparatus, comprising:

means for dividing an input speech signal into a plurality of frames;

means for finding a predetermined order number of spectrum parameters from the speech signal;

means for vector quantizing the spectrum parameters;

means for scalar quantizing difference signals between the spectrum parameters and the vector quantized values;

means for determining a predetermined order number of quantizing ranges for the scalar quantization for each of a predetermined number of codevectors from said vector quantizing means;

means for producing a plurality of candidate quantizing values for each order number of the spectrum parameters for the scalar quantization;

means for modifying, using each of the candidates, a quantizing range of an adjacent spectrum parameter; and means for accumulating a predetermined order number of quantizing distortions by the quantizing values and producing a quantized value sequence which minimizes the accumulated distortion.

* * * * *